(12) United States Patent
Li

(10) Patent No.: US 12,230,956 B2
(45) Date of Patent: Feb. 18, 2025

(54) CURRENT LIMITING CIRCUITS

(71) Applicant: TCL China Star Optoelectronics Technology Co., Ltd., Shenzhen (CN)

(72) Inventor: Haoran Li, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/605,024

(22) PCT Filed: Jul. 27, 2021

(86) PCT No.: PCT/CN2021/108529
§ 371 (c)(1),
(2) Date: Jan. 26, 2023

(87) PCT Pub. No.: WO2023/000355
PCT Pub. Date: Jan. 26, 2023

(65) Prior Publication Data
US 2024/0022067 A1   Jan. 18, 2024

(30) Foreign Application Priority Data

Jul. 20, 2021   (CN) .......................... 202110816823.1

(51) Int. Cl.
*H02H 9/02*   (2006.01)
(52) U.S. Cl.
CPC ................................... *H02H 9/02* (2013.01)
(58) Field of Classification Search
CPC .......... H02H 9/02; H02H 9/025; H02H 7/205; G09G 2330/025

(Continued)

(56) References Cited

U.S. PATENT DOCUMENTS 6,424,512 B1   7/2002  Schmacht
10,720,768 B2 *  7/2020  Asanza Maldonado .....................
                                             H02H 1/04

(Continued)

FOREIGN PATENT DOCUMENTS

CN         1089043 A      7/1994
CN       101291103 A   * 10/2008
(Continued)

OTHER PUBLICATIONS

International Search Report in International application No. PCT/CN2021/108529, mailed on Apr. 20, 2022.
(Continued)

*Primary Examiner* — Thienvu V Tran
*Assistant Examiner* — Sreeya Sreevatsa
(74) *Attorney, Agent, or Firm* — Nathan & Associates; Menachem Nathan

(57) ABSTRACT

A current limiting circuit includes a first voltage terminal, a second voltage terminal, a first transistor and a current limiting module. An input terminal of the first transistor is electrically connected to the first voltage terminal, and an output terminal of the first transistor is electrically connected to the second voltage terminal. The current limiting module is electrically connected to the input terminal of the first transistor and a control terminal of the first transistor. The current limiting module is configured to control voltage difference between the control terminal of the first transistor and the input terminal of the first transistor for controlling a state of the first transistor so that a current limiting value of the current limiting circuit is adjustable.

18 Claims, 3 Drawing Sheets

(58) Field of Classification Search
USPC .......................................................... 361/93.9
See application file for complete search history.

(56) References Cited

U.S. PATENT DOCUMENTS

| | | |
|---|---|---|
| 2013/0278236 A1 | 10/2013 | Nakahara |
| 2021/0026383 A1 | 1/2021 | Sivaraj et al. |

FOREIGN PATENT DOCUMENTS

| | | | | |
|---|---|---|---|---|
| CN | 103259408 | A | 8/2013 | |
| CN | 103904889 | A | 7/2014 | |
| CN | 104485819 | A | 4/2015 | |
| CN | 105281422 | A | 1/2016 | |
| CN | 106981979 | A | 7/2017 | |
| CN | 106982051 | A | 7/2017 | |
| CN | 208257482 | U | 12/2018 | |
| CN | 111064159 | A * | 4/2020 | |
| CN | 111162510 | A | 5/2020 | |
| CN | 111669151 | A | 9/2020 | |
| CN | 111987703 | A | 11/2020 | |
| CN | 112332366 | A | 2/2021 | |
| CN | 212518393 | U | 2/2021 | |
| EP | 2475099 | A2 * | 7/2012 | ............ H02H 9/025 |
| JP | H01270727 | A | 10/1989 | |
| JP | H06232646 | A | 8/1994 | |
| JP | 2001022456 | A | 1/2001 | |
| JP | 2005202985 | A | 7/2005 | |
| JP | 2012160928 | A | 8/2012 | |
| JP | 6814202 | B2 | 1/2021 | |

OTHER PUBLICATIONS

Written Opinion of the International Search Authority in International application No. PCT/CN2021/108529,mailed on Apr. 20, 2022.
Chinese Office Action issued in corresponding Chinese Patent Application No. 202110816823.1 dated Mar. 14, 2022, pp. 1-8.
Korean Office Action issued in corresponding Korean Patent Application No. 10-2021-7028992 dated Apr. 28, 2023, pp. 1-4.
Japanese Office Action issued in corresponding Japanese Patent Application No. 特願2021-547780 dated Sep. 12, 2023, pp. 1-3.

* cited by examiner

CURRENT LIMITING CIRCUITS

FIELD OF THE DISCLOSURE

The present disclosure relates to a field of display technology, and more particularly, to a current limiting circuit.

BACKGROUND

In the display panel industry, traditional power management integrated chips will perform a current limiting operation during the start-up of an AVDD voltage. The purpose of the current limiting operation is to slowly turn on isolation transistors and smoothly establish the AVDD voltage to prevent excessive currents from damaging other electronic components in the loop.

However, the disadvantage of the conventional design is that the current limiting value for the AVDD voltage is constant. If the current limiting value is excessively small, the power management integrated chip cannot establish the voltage within the specified time during booting-up under a heavy-load due to the current limiting, and, thus, the booting-up fails; if the current limiting value is excessively large, the components of the power management integrated chip are damaged by the long-term high current when the back-end load is short-circuited, for example, the source driver is damaged and on fire.

SUMMARY

Technical Problem

Thus, the present disclosure provides a current limiting circuit which can make a current limiting value of the current limiting circuit adjustable, thereby preventing the power management integrated chip from causing the failed booted-up under a heavy load and further preventing the power management integrated chip from being damaged due to a short-circuited back-end load during the booting-up.

Technical Solution

In a first aspect, an embodiment of the present disclosure is to provide a current limiting circuit. The current limiting circuit includes a first voltage terminal, a second voltage terminal, a first transistor and a current limiting module. An input terminal of the first transistor is electrically connected to the first voltage terminal, and an output terminal of the first transistor is electrically connected to the second voltage terminal. The current limiting module is electrically connected to the input terminal of the first transistor and a control terminal of the first transistor. The current limiting module is configured to control voltage difference between the control terminal of the first transistor and the input terminal of the first transistor for controlling a state of the first transistor so that a current limiting value of the current limiting circuit is adjustable.

Optionally, the current limiting module comprises a second transistor, a first resistor, a third transistor, and a regulation unit. A first terminal of the second transistor is electrically connected to a first control terminal, a second terminal of the second transistor is electrically connected to the input terminal of the first transistor, and a third terminal of the second transistor is electrically connected to the control terminal of the first transistor. A first terminal of the first resistor is electrically connected to the input terminal of the first transistor, and a second terminal of the first resistor is electrically connected to the control terminal of the first transistor. A first terminal of the third transistor is electrically connected to a second control terminal, a second terminal of the third transistor is electrically connected to the control terminal of the first transistor, and a third terminal of the third transistor is connected to the regulation unit. The regulation unit is configured to control the state of the first transistor.

Optionally, the regulation unit comprises a plurality of resistive control sub-units which are arranged in parallel. Respective first terminals of the plurality of resistive control sub-units are electrically connected to the third terminal of the third transistor. Respective second terminals of the plurality of resistive control sub-units are electrically connected to a ground terminal, and each of the plurality of resistive control sub-units comprises a second resistor.

Optionally, the voltage difference between the control terminal of the first transistor and the input terminal of the first transistor T1 is obtained according to a formula: $Vgs=-V1*R1/(R1+Rx)$, where Vgs represents the voltage difference between the control terminal of the first transistor and the input terminal of the first transistor, V1 represents a voltage value of the input terminal of the first transistor, R1 represents a resistance value of the first resistor, and Rx represents a resistance value of x resistive control sub-units arranged in parallel.

Optionally, the current limiting circuit further comprises a fourth transistor. An input terminal of the fourth transistor is electrically connected to the first voltage terminal, and an output terminal of the fourth transistor is electrically connected to the second voltage terminal.

Optionally, the current limiting circuit further comprises a timing unit, a comparison unit, and a constant current unit. The timing unit is electrically connected to a first terminal of the comparison unit. A second terminal of the comparison unit is electrically connected to the second voltage terminal. A third terminal of the comparison unit receives a constant voltage signal. A fourth terminal of the comparison unit is electrically connected to a first terminal of the constant current unit. A second terminal of the constant current unit is electrically connected to a control terminal of the fourth transistor, The timing unit is configured to output a comparison-unit control signal at intervals with a preset time. The comparison unit is controlled by the comparison-unit control signal to output a constant-current-unit control signal at the fourth terminal of the comparison unit to the first terminal of the constant current unit based on a voltage at the second terminal of the comparison unit and the voltage at the third terminal of the comparison unit. The constant current unit is controlled by the constant-current-unit control signal to output a constant current.

Optionally, the timing unit comprises a timer that is electrically connected to the first terminal of the comparison unit.

Optionally, the comparison unit comprises a comparator. A first terminal of the comparator is electrically connected to the timing unit. A second terminal of the comparator is electrically connected to the second voltage terminal. A third terminal of the comparator receives the constant voltage signal. A fourth terminal of the comparator is electrically connected to the first terminal of the constant current unit.

Optionally, the constant current unit comprises a constant current source. A first terminal of the constant current source is electrically to the fourth terminal of the comparison unit, a second terminal of the constant current source is electrically to the control terminal of the fourth transistor, and a third terminal of the constant current source is electrically to a ground terminal.

Optionally, a voltage value of constant voltage signal in a range between 0.85 times a voltage value of the first voltage terminal and 0.9 times the voltage value of the first voltage terminal.

In a second aspect, an embodiment of the present disclosure is to provide a current limiting circuit. The current limiting circuit includes a first voltage terminal, a second voltage terminal, a first transistor and a current limiting module. An input terminal of the first transistor is electrically connected to the first voltage terminal, and an output terminal of the first transistor is electrically connected to the second voltage terminal. The current limiting module is electrically connected to the input terminal of the first transistor and a control terminal of the first transistor. The current limiting module is configured to control voltage difference between the control terminal of the first transistor and the input terminal of the first transistor for controlling a state of the first transistor so that a current limiting value of the current limiting circuit is adjustable. The current limiting module comprises a second transistor, a first resistor, a third transistor, and a regulation unit. A first terminal of the second transistor is electrically connected to a first control terminal, a second terminal of the second transistor is electrically connected to the input terminal of the first transistor, and a third terminal of the second transistor is electrically connected to the control terminal of the first transistor. A first terminal of the first resistor is electrically connected to the input terminal of the first transistor, and a second terminal of the first resistor is electrically connected to the control terminal of the first transistor. A first terminal of the third transistor is electrically connected to a second control terminal, a second terminal of the third transistor is electrically connected to the control terminal of the first transistor, and a third terminal of the third transistor is connected to the regulation unit. The regulation unit is configured to control the state of the first transistor. The current limiting circuit further comprises a fourth transistor. An input terminal of the fourth transistor is electrically connected to the first voltage terminal, and an output terminal of the fourth transistor is electrically connected to the second voltage terminal.

Optionally, the regulation unit comprises a plurality of resistive control sub-units which are arranged in parallel. Respective first terminals of the plurality of resistive control sub-units are electrically connected to the third terminal of the third transistor. Respective second terminals of the plurality of resistive control sub-units are electrically connected to a ground terminal, and each of the plurality of resistive control sub-units comprises a second resistor.

Optionally, the voltage difference between the control terminal of the first transistor and the input terminal of the first transistor T1 is obtained according to a formula: $Vgs=-V1*R1/(R1+Rx)$, where Vgs represents the voltage difference between the control terminal of the first transistor and the input terminal of the first transistor, V1 represents a voltage value of the input terminal of the first transistor, R1 represents a resistance value of the first resistor, and Rx represents a resistance value of x resistive control sub-units arranged in parallel.

Optionally, the current limiting circuit further comprises a timing unit, a comparison unit, and a constant current unit. The timing unit is electrically connected to a first terminal of the comparison unit. A second terminal of the comparison unit is electrically connected to the second voltage terminal.

A third terminal of the comparison unit receives a constant voltage signal. A fourth terminal of the comparison unit is electrically connected to a first terminal of the constant current unit. A second terminal of the constant current unit is electrically connected to a control terminal of the fourth transistor, The timing unit is configured to output a comparison-unit control signal at intervals with a preset time. The comparison unit is controlled by the comparison-unit control signal to output a constant-current-unit control signal at the fourth terminal of the comparison unit to the first terminal of the constant current unit based on a voltage at the second terminal of the comparison unit and the voltage at the third terminal of the comparison unit. The constant current unit is controlled by the constant-current-unit control signal to output a constant current.

Optionally, the timing unit comprises a timer that is electrically connected to the first terminal of the comparison unit.

Optionally, the comparison unit comprises a comparator. A first terminal of the comparator is electrically connected to the timing unit. A second terminal of the comparator is electrically connected to the second voltage terminal. A third terminal of the comparator receives the constant voltage signal. A fourth terminal of the comparator is electrically connected to the first terminal of the constant current unit.

Optionally, the constant current unit comprises a constant current source. A first terminal of the constant current source is electrically to the fourth terminal of the comparison unit, a second terminal of the constant current source is electrically to the control terminal of the fourth transistor, and a third terminal of the constant current source is electrically to a ground terminal.

Optionally, a voltage value of constant voltage signal in a range between 0.85 times a voltage value of the first voltage terminal and 0.9 times the voltage value of the first voltage terminal.

Advantageous Effect

The current limiting circuit of the embodiment of the present disclosure controls the state of the first transistor through outputting a control signal by the current limiting module to the control terminal of the first transistor so that the current limiting value of the current limiting circuit are adjustable, thereby preventing the power management integrated chip from causing the failed booted-up under a heavy load and further preventing the power management integrated chip from being damaged due to a short-circuited back-end load during the booting-up.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

The current limiting circuit of the embodiment of the present disclosure controls the state of the first transistor through outputting a control signal by the current limiting module to the control terminal of the first transistor so that the current limiting value of the current limiting circuit are adjustable, thereby preventing the power management integrated chip from causing the failed booted-up under a heavy load and further preventing the power management integrated chip from being damaged due to a short-circuited back-end load during the booting-up.

The transistors used in the embodiments of the present disclosure may include P-type transistors and/or N-type transistors. When the gate of the P-type transistor is applied with low level voltage, the source and drain are conducted. When the gate is applied with high level voltage, the source and the drain are not conducted. When the gate of the N-type transistor is applied with high level voltage, the source and drain are, conducted. When the gate of the N-type transistor is applied with ow level voltage, the source and the drain are not, conducted.

Figure 1:
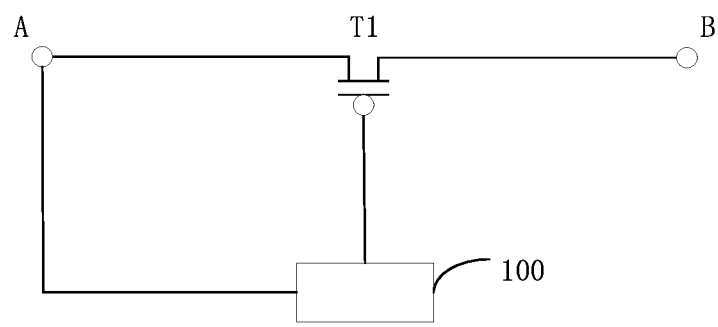
FIG. 1 is a structural schematic diagram of a current limiting circuit according to an exemplary embodiment of the present disclosure.

Please refer to FIG. 1. FIG. 1 is a structural schematic diagram of a current limiting circuit according to an exemplary embodiment of the present disclosure. As shown in FIG. 1, the current limiting circuit 10 comprises a first voltage terminal A, a second voltage terminal B, a first transistor T1, and a current limiting module 100. The input terminal of the first transistor T1 and the output terminal of the first transistor T1 are connected in series on the path formed by the first voltage terminal A and the second voltage terminal B. The current limiting module 100 is electrically connected to the input terminal of the first transistor T1 and the control terminal of the first transistor T1. The current limiting module 100 is configured to control the voltage difference between the control terminal of the first transistor T1 and the input terminal of the first transistor T1 for controlling the state of the first transistor T1 so that the current limiting value of the current limiting circuit 10 is adjustable. The first terminal of the first transistor T1 is one of the source and the drain of the transistor, and the second terminal of the first transistor T1 is the other of the source and the drain of the transistor. The control terminal is the gate of the transistor.

The first voltage terminal A may serve as an operation voltage input terminal of a power management integrated chip, and the second voltage terminal B may serve as an AVDD voltage output terminal. In the display panel industry, the power management integrated chip will perform a current limiting operation during the start-up of the AVDD voltage. The purpose is to slowly turn on an isolation transistor and smoothly establish up the AVDD voltage, thereby preventing excessive currents from damaging other electronic components in the loop.

If the current limiting value of the current limiting circuit 10 is excessively small, the power management integrated chip cannot establish the voltage within the specified time during booting-up under a heavy-load due to the current limiting, and, thus, the booting-up fails; if the current limiting value of the current limiting circuit 10 is excessively large, the components of the power management integrated chip are damaged by the long-term high current when the back-end load is short-circuited. In the embodiment of the present disclosure, the current limiting value of the current limiting circuit 10 is adjustable. The current limiting circuit 10 of the embodiment of the present disclosure is capable of setting the current limiting value of the current limiting circuit 10 according to the actual situation, so that the current limiting value of the current limiting circuit 10 is adjusted, which prevents the power management integrated chip from causing the failed booted-up under a heavy load and further prevents the power management integrated chip from being damaged due to a short-circuited back-end load during the booting-up.

Figure 2:
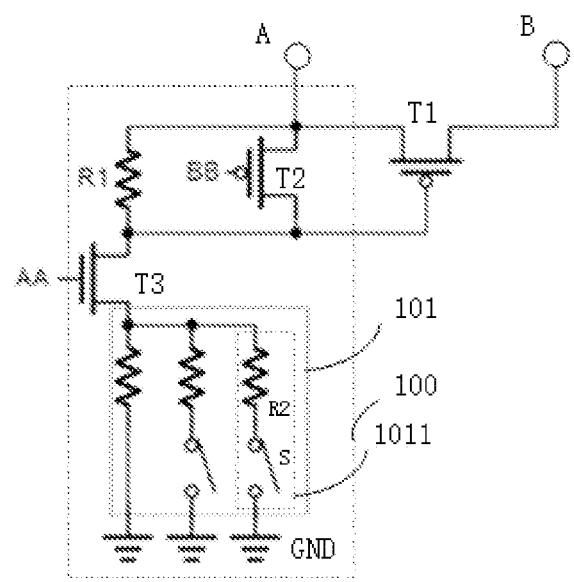
FIG. 2 is a circuit diagram of a current limiting circuit according to an exemplary embodiment of the present disclosure.

Please refer to FIG. 2. FIG. 2 is a circuit diagram of a current limiting circuit according to an exemplary embodiment of the present disclosure. The current limiting module 100 comprises a second transistor T2, a first resistor R1, a third transistor T3, and a regulation unit 101. The first terminal of the second transistor T2 is electrically connected to a first control terminal BB. The second terminal of the second transistor T2 is electrically connected to the input terminal of the first transistor T1. The third terminal of the second transistor T2 is electrically connected to the control terminal of the first transistor T1. The first terminal of the first resistor R1 is electrically connected to the input terminal of the first transistor T1. The second terminal of the first resistor R1 is electrically connected to the control terminal of the first transistor T1. The first terminal of the third transistor T3 is electrically connected to a second control terminal AA. The second terminal of the third transistor T3 is electrically connected to the control terminal of the first transistor T1. The third terminal of the third transistor T3 is connected to the regulation unit 101.

The regulation unit 101 is configured to control the state of the first transistor T1. The regulation unit 101 comprises a plurality of resistive control sub-units 1011 which are arranged in parallel. The respective first terminals of the resistive control sub-units 1011 are electrically connected to the third terminal of the third transistor T3. The respective second terminals of the resistive control sub-units 1011 are electrically connected to a ground terminal GND. Each resistive control sub-unit 1011 comprises a second resistor R2. One of the resistive control sub-unit 1011 is provided with only a second resistor R2, while each of the other resistive control sub-units 1011 comprises a second resistor R2 and a switch S, wherein the second resistor R2 and the switch S are connected in series.

The voltage difference between the control terminal of the first transistor T1 and the input terminal of the first transistor T1 can be obtained according to the following formula: $Vgs=-V1*R1/(R1+Rx)$, wherein Vgs represents the voltage difference between the control terminal of the first transistor T1 and the input terminal of the first transistor T1, V1 represents the voltage value of the input terminal of the first transistor T1, R1 represents the resistance value of the first resistor, and Rx represents the resistance value of x resistive control sub-units 1011 arranged in parallel.

Both the first transistor T1 and the second transistor T2 are implemented by P-type transistors, and the third transistor T3 is implemented by an N-type transistor. The following description will be made by taking the transistor type in the embodiment of the present disclosure as an example.

Figure 3:
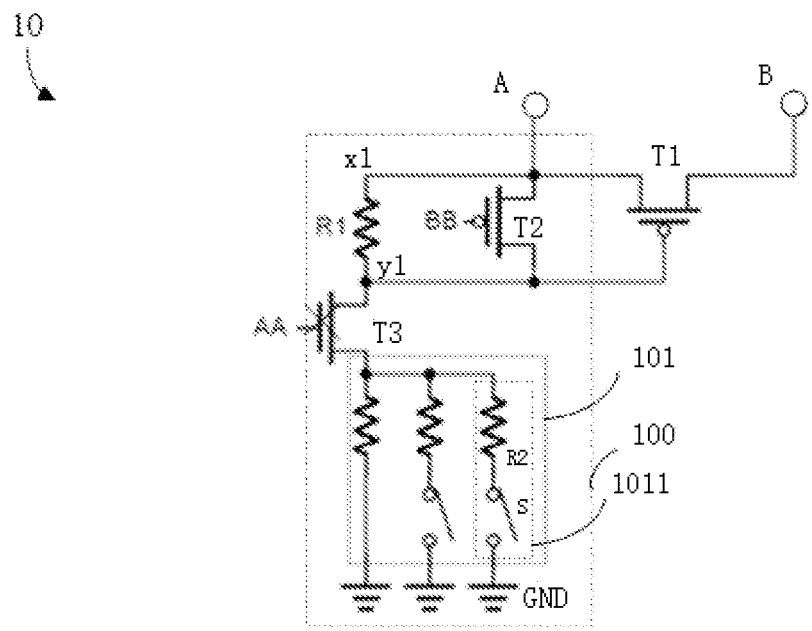
FIG. 3 is a structural schematic diagram of a current limiting circuit according to another exemplary embodiment of the present disclosure.

Please refer to FIG. 3. FIG. 3 is a schematic diagram showing a first state of the current limiting circuit according to an embodiment of the present disclosure. When the first transistor T1 is inactivated, the voltage at the second control terminal AA is a low potential which causes the third transistor T3 to be turned off, and the voltage at of the first control terminal BB is a low potential which causes the second transistor T2 to be turned on. At this time, the potential of the node x1 is equal to the potential of the node y1, the potential of the control terminal of the first transistor T1 is equal to the potential of the node y1, and the potential of the input terminal of the first transistor is equal to the potential of the node x1, which results in Vgs=0. Thus, the first transistor T1 is inactivated.

Figure 4:
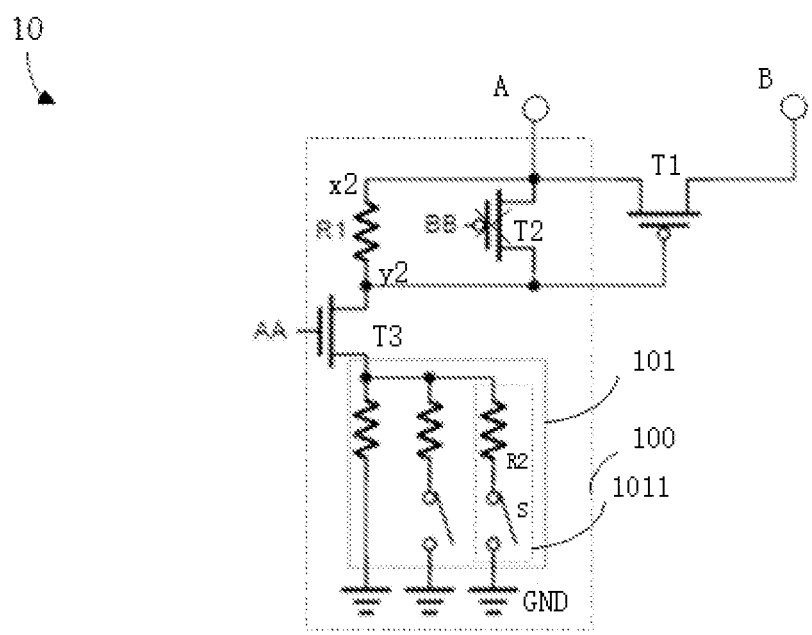
FIG. 4 is a circuit diagram of a current limiting circuit according to an exemplary embodiment of the present disclosure.

Please refer to FIG. 4. FIG. 4 is a schematic diagram showing a second state of the current limiting circuit according to an embodiment of the present disclosure. When the first transistor T1 is activated, the voltage at the second control terminal AA is a high potential which causes the third transistor T3 to be turned on, and the potential of the first control terminal BB is a high potential which causes the second transistor T2 to be turned off. At this time, the potential of the node x2 is equal to the potential of the input terminal of the first transistor T1. According to the principle of voltage division achieved by resistors, the potential of the node y2 can be obtained according to the following formula: y2=V1*Rx/(R1+Rx), wherein V1 represents the voltage value of the input terminal of the first transistor T1, R1 represents the resistance value of the first resistor, and Rx represents the resistance value of x resistive control sub-units 1011 arranged in parallel. The potential of the control terminal of the first transistor T1 is equal to the potential of the node y2. At this time, Vgs=y2−x2=−V1*R1/(R1+Rx), wherein Vgs represents the voltage difference between the control terminal of the first transistor T1 and the input terminal of the first transistor T1, V1 represents the voltage value of the input terminal of the first transistor T1, R1 represents the resistance value of the first resistor R1, and Rx represents the resistance value of x resistive control sub-units 1011 arranged in parallel. Thus, the first transistor T1 is turned on, and the degree of the turned-on state of the first transistor T1 is determined by the resistance value of x resistive control sub-units 1011 arranged in parallel.

Based on the above embodiment, the current limiting circuit 10 provided by the present disclosure controls the voltage difference between the control terminal of the first transistor T1 and the input terminal of the first transistor T1 through controlling the state of the first transistor T1 by the current limiting module 100 so that the current limiting value of the current limiting circuit 10 is adjustable, thereby which prevents the power management integrated chip from causing the failed booted-up under a heavy load and further prevents the power management integrated chip from being damaged due to a short-circuited back-end load during the booting-up.

Figure 5:
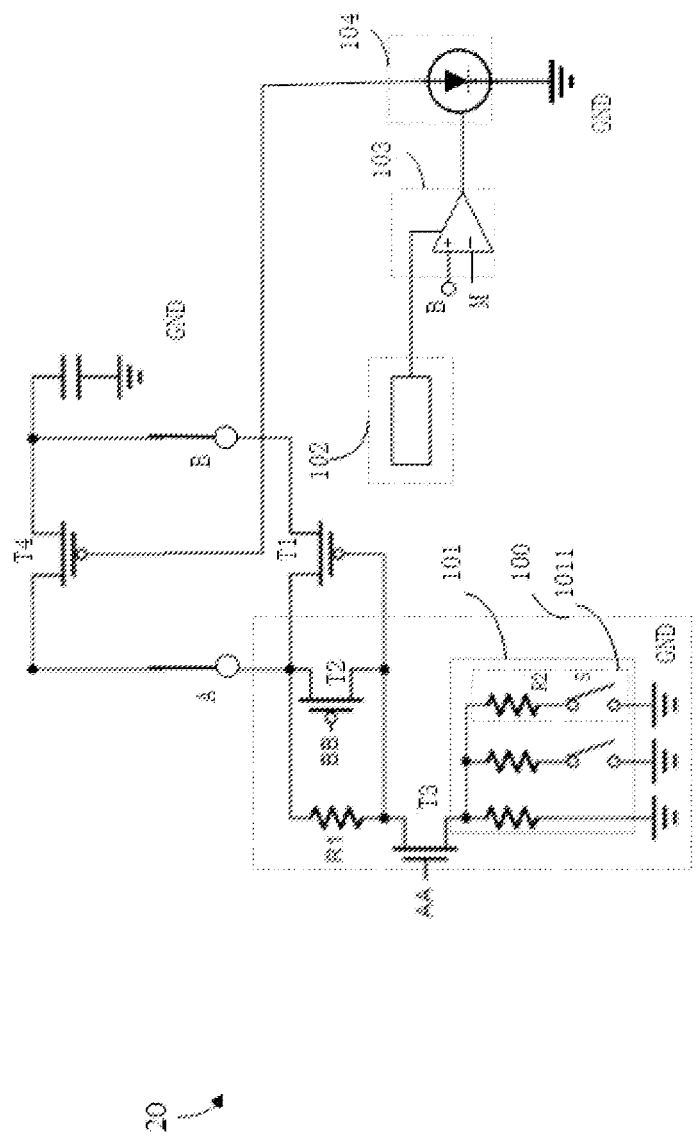
FIG. 5 is a circuit diagram of a current limiting circuit according to another exemplary embodiment of the present disclosure.

Please refer to FIG. 5. FIG. 5 is a circuit diagram of a current limiting circuit 20 according to another exemplary embodiment of the present disclosure. Different from the current limiting circuit 10 shown in FIG. 2, the current limiting circuit 20 further comprises a fourth transistor T4, a timing unit 102, a comparison unit 103, and a constant current unit 104.

The input terminal of the fourth transistor T4 is electrically connected to the first voltage terminal A. The output terminal of the fourth transistor T4 is electrically connected to the second voltage terminal B. The timing unit 102 is electrically connected to the first terminal of the comparison unit 103. The second terminal of the comparison unit 103 is electrically connected to the second voltage terminal B. The third terminal of the comparison unit 103 receives a constant voltage signal M. The fourth terminal of the comparison unit 103 is electrically connected to the first terminal of the constant current unit 104. The second terminal of the constant current unit 104 is electrically connected to the control terminal of the fourth transistor T4.

The timing unit 102 is configured to output a comparison-unit control signal at intervals with a preset time. The comparison unit 103 is controlled by the comparison-unit control signal to output a constant-current-unit control signal at the fourth terminal of the comparison unit 103 to the first terminal of the constant current unit 104 based on the voltage at the second terminal of the comparison unit 103 and the voltage at the third terminal of the comparison unit 103. The constant current unit 104 is controlled by the constant-current-unit control signal to output a constant current.

The timing unit 102 operates as a register for setting the current limiting time. That is, the timing unit 102 is configured to output the comparison-unit control signal at intervals with a preset time. When the first terminal of the constant current unit 104 receives the constant-current-unit control signal, the constant current unit 104 starts to operate; when the first terminal of the constant current unit 104 does not receive the constant-current-unit control signal, the constant current unit 104 stops operating.

The function of the comparison unit 103 is to compare magnitudes of two voltages (using a high or low level of an output voltage to indicate the relationship between the magnitudes of the two input voltages). When the voltage at the "positive (+)" input terminal is higher than the voltage at the "negative (−)" input terminal, the voltage comparator outputs a high-level signal; when the voltage at the "+" input terminal is lower than the voltage at the "−" input terminal, the voltage comparator outputs a low-level voltage.

The comparison unit 103 compares the voltage at the second terminal and the voltage at the third terminal and outputs the constant-current-unit control signal at the fourth terminal of the comparison unit 103 to the first terminal of the constant current unit 104.

The first terminal of the comparison unit 103 is an enable terminal, the second terminal of the comparison unit 103 is a "positive (+)" input terminal, the third terminal of the comparison unit 103 is a "negative (−)" input terminal, and the fourth terminal of the comparison unit 103 is an output terminal. When the first terminal of the comparison unit 103 receives the comparison-unit control signal, the comparison unit 103 starts to operate; when the first terminal of the comparison unit 103 does not receives the comparison-unit control signal, the comparison unit 103 stops operating. When the voltage at the second terminal of the comparison unit 103 is higher than the voltage at the third terminal of the comparison unit 103, the constant-current-unit control signal output by the fourth terminal of the comparison unit 103 is at a high voltage level; when the voltage at the second terminal of the comparison unit 103 is lower than the voltage at the third terminal of the comparison unit 103, the constant-current-unit control signal output by the fourth terminal of the comparison unit 103 is at a low voltage level.

The constant current unit 104 provide a constant current, which is independent of the voltage across the two terminals, to the outside. The constant current unit 104 has two basic properties: first, the current provided by the constant current unit 104 is constant and independent of the voltage cross the two terminals; second, the current of the constant current unit 104 is determined, and the voltage across the two terminals are arbitrary. That is, the constant current unit 104 is controlled by the control signal of the constant current unit 104 output a constant current.

The timing unit 102 comprises a timer. The timer is electrically connected to the first terminal of the comparison unit 103. The timer outputs a high voltage signal every interval with a preset time. For example, the timer can be set to different detection time scales, such as 4 milliseconds, 6 milliseconds, 8 milliseconds, or 10 milliseconds.

The comparison unit 103 comprises a comparator. The first terminal of the comparator is electrically connected to the timing unit 102. The second terminal of the comparator is electrically connected to the second voltage terminal B. The third terminal of the comparator receives the constant voltage signal M. The fourth terminal of the comparator is electrically connected to the first terminal of the constant current unit 104.

The first terminal of the comparator is an enable terminal, the second terminal of the comparator is a "positive (+)" input terminal, the third terminal of the comparator is a "negative (−)" input terminal, and the fourth terminal of the comparator is an output terminal. When the first terminal of the comparator is at a high voltage level, the comparator starts to operate. When the first terminal of the comparator is at a low voltage level, the comparator stops operating. When the voltage at the second terminal of the comparator is higher than the voltage at the third terminal of the comparator, the constant-current-unit control signal output by the fourth terminal of the comparator is at a high voltage level; when the voltage at the second terminal of the comparator is less than the voltage at the third terminal of the comparator, the constant-current-unit control signal output by the output terminal of the comparator is at a low voltage level.

The comparator is configured to compare the voltage at the second voltage terminal B with the voltage of the constant voltage signal M. When the voltage at the second voltage terminal B is higher than the voltage of the constant voltage signal M, the comparator outputs a high-level voltage; when the voltage at the second voltage terminal B is lower than the voltage of the constant voltage signal M, the comparator outputs a low-level voltage.

The voltage value of the constant voltage signal M is in a range between 0.85 times the voltage value of the first voltage terminal A and 0.9 times the voltage value of the first voltage terminal A. In some embodiments, the voltage value of the constant voltage signal M may be set to a value between 0.85 times the voltage value of the first voltage terminal A and 0.9 times the voltage value of the first voltage terminal A. In other some embodiments, a multiplier may be connected in series between the first voltage terminal A and the third terminal of the comparison unit 103, so that the voltage value of the constant voltage signal M is equal to a value between 0.85 times the voltage value of the first voltage terminal A and 0.9 times the voltage value of the first voltage terminal A.

Take the timer being set to 4 milliseconds and the constant voltage signal M being set to 0.9 times the voltage value of the first voltage terminal A as an example for description. The timer is a register for setting the current limiting time, and the current limiting time is currently set to 4 milliseconds. When the timer completes 4-milliseconds timing, the voltage value of the second voltage terminal B is compared with 0.9 times the voltage of the first voltage terminal A. If the voltage value of the second voltage terminal B is less than 0.9 times the voltage of the first voltage terminal A, the back-end load is abnormal. At this time, the voltage level of the control terminal of the second transistor T2 is switched to a low level from a high level, the second transistor T2 is turned on, the first transistor T1 is turned off, the constant current source is inactivated, and the power management integrated chip stops operating. If the voltage value of the second voltage terminal B is greater than 0.9 times the voltage of the first voltage terminal A, the circuit functions normally. At this time, the voltage level of the control terminal of the second transistor T2 is switched to a low level from a high level, the second transistor T2 is turned on, the first transistor T1 is turned off, the constant current source is activated, the voltage at the control terminal of the fourth transistor T4 is pulled down, and the fourth transistor T4 is turned on. The external fourth transistor T4 performs the isolation operation of the current limiting circuit.

The first transistor T1 and the current limiting module 100 are disposed in the power management integrated chip. The fourth transistor T4, the timing unit 102, comparison unit 103, and the constant current unit 104 are disposed outside the power management integrated chip. In the embodiments of the present disclosure, the first transistor and the current limiting unit are disposed in the power management integrated chip, which results in that the accuracy of the current limit value can be guaranteed under conditions of both high and low temperature due to their good temperature characteristics and high precision. Since the resistance and the Vgs-Id curve of the first transistor do not change much with the temperature, the present disclosure has relatively better temperature characteristics, and the stability of the current limit value can be guaranteed at both high temperature (85° C.) and low temperature (−20° C.).

The current limiting circuit of the embodiments of the present disclosure outputs a control signal to the control terminal of the isolation transistor to control the state of the isolation transistor so that the current limiting value and the current limiting time of the current limiting circuit are adjustable, thereby preventing the power management integrated chip from causing the failed booted-up under a heavy load and further preventing the power management integrated chip from being damaged due to a short-circuited back-end load during the booting-up.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A current limiting circuit, comprising:
a first voltage terminal;
a second voltage terminal;
a first transistor, wherein an input terminal of the first transistor is electrically connected to the first voltage terminal, and an output terminal of the first transistor is electrically connected to the second voltage terminal; and a current limiting module electrically connected to the input terminal of the first transistor and a control terminal of the first transistor, wherein the current limiting module is configured to control voltage difference between the control terminal of the first transistor and the input terminal of the first transistor for controlling a state of the first transistor so that a current limiting value of the current limiting circuit is adjustable;

wherein the current limiting module comprises a second transistor, a first resistor, a third transistor, and a regulation unit, wherein a first terminal of the second transistor is electrically connected to a first control terminal, a second terminal of the second transistor is electrically connected to the input terminal of the first transistor, and a third terminal of the second transistor is electrically connected to the control terminal of the first transistor, wherein a first terminal of the first resistor is electrically connected to the input terminal of the first transistor, and a second terminal of the first resistor is electrically connected to the control terminal of the first transistor, wherein a first terminal of the third transistor is electrically connected to a second control terminal, a second terminal of the third transistor is electrically connected to the control terminal of the first transistor, and a third terminal of the third transistor is connected to the regulation unit, and wherein the regulation unit is configured to control the state of the first transistor.

2. The current limiting circuit of claim 1, wherein the regulation unit comprises a plurality of resistive control sub-units which are arranged in parallel, and wherein respective first terminals of the plurality of resistive control sub-units are electrically connected to the third terminal of the third transistor, respective second terminals of the plurality of resistive control sub-units are electrically connected to a ground terminal, and each of the plurality of resistive control sub-units comprises a second resistor.

3. The current limiting circuit of claim 2, wherein the voltage difference between the control terminal of the first transistor and the input terminal of the first transistor T1 is obtained according to a formula:

$Vgs=-V1*R1/(R1+Rx)$, and wherein Vgs represents the voltage difference between the control terminal of the first transistor and the input terminal of the first transistor, V1 represents a voltage value of the input terminal of the first transistor, R1 represents a resistance value of the first resistor, and Rx represents a resistance value of x resistive control sub-units arranged in parallel.

4. The current limiting circuit of claim 1, further comprising a fourth transistor, wherein an input terminal of the fourth transistor is electrically connected to the first voltage terminal, and an output terminal of the fourth transistor is electrically connected to the second voltage terminal.

5. The current limiting circuit of claim 4, further comprising a timing unit, a comparison unit, and a constant current unit, wherein the timing unit is electrically connected to a first terminal of the comparison unit, a second terminal of the comparison unit is electrically connected to the second voltage terminal, a third terminal of the comparison unit receives a constant voltage signal, a fourth terminal of the comparison unit is electrically connected to a first terminal of the constant current unit, and a second terminal of the constant current unit is electrically connected to a control terminal of the fourth transistor, wherein the timing unit is configured to output a comparison-unit control signal at intervals with a preset time, wherein the comparison unit is controlled by the comparison-unit control signal to output a constant-current-unit control signal at the fourth terminal of the comparison unit to the first terminal of the constant current unit based on a voltage at the second terminal of the comparison unit and the voltage at the third terminal of the comparison unit, and wherein the constant current unit is controlled by the constant-current-unit control signal to output a constant current.

6. The current limiting circuit of claim 5, wherein the timing unit comprises a timer, and the timer is electrically connected to the first terminal of the comparison unit.

7. The current limiting circuit of claim 5, wherein the comparison unit comprises a comparator, wherein a first terminal of the comparator is electrically connected to the timing unit, a second terminal of the comparator is electrically connected to the second voltage terminal, a third terminal of the comparator receives the constant voltage signal, and a fourth terminal of the comparator is electrically connected to the first terminal of the constant current unit.

8. The current limiting circuit of claim 5, wherein the constant current unit comprises a constant current source, wherein a first terminal of the constant current source is electrically to the fourth terminal of the comparison unit, a second terminal of the constant current source is electrically to the control terminal of the fourth transistor, and a third terminal of the constant current source is electrically to a ground terminal.

9. The current limiting circuit of claim 5, wherein a voltage value of constant voltage signal in a range between 0.85 times a voltage value of the first voltage terminal and 0.9 times the voltage value of the first voltage terminal.

10. A current limiting circuit, comprising:
a first voltage terminal;
a second voltage terminal;
a first transistor, wherein an input terminal of the first transistor is electrically connected to the first voltage terminal, and an output terminal of the first transistor is electrically connected to the second voltage terminal; and
a current limiting module electrically connected to the input terminal of the first transistor and a control terminal of the first transistor, the current limiting module comprising:
a second transistor, having a first terminal electrically connected to a first control terminal, a second terminal electrically connected to the input terminal of the first transistor, and a third terminal electrically connected to the control terminal of the first transistor;
a first resistor, connected between the input terminal of the first transistor and the control terminal of the first transistor;
a regulation unit, configured to control the state of the first transistor; and a third transistor, having a first terminal electrically connected to a second control terminal, a second terminal electrically connected to the control terminal of the first transistor, and a third terminal connected to the regulation unit; and a fourth transistor, having an input terminal electrically connected to the first voltage terminal, and an output terminal electrically connected to the second voltage terminal;

wherein the current limiting module is configured to control voltage difference between the control terminal of the first transistor and the input terminal of the first transistor for controlling a state of the first transistor so that a current limiting value of the current limiting circuit is adjustable.

11. The current limiting circuit of claim 10, wherein the regulation unit comprises a plurality of resistive control sub-units which are arranged in parallel, and wherein respective first terminals of the plurality of resistive control sub-units are electrically connected to the third terminal of the third transistor, respective second terminals of the plurality of resistive control sub-units are electrically connected to a ground terminal, and each of the plurality of resistive control sub-units comprises a second resistor.

12. The current limiting circuit of claim 11, wherein the voltage difference between the control terminal of the first transistor and the input terminal of the first transistor is obtained according to a formula:

$Vgs=-V1*R1/(R1+Rx)$, and wherein Vgs represents the voltage difference between the control terminal of the first transistor and the input terminal of the first transistor, V1 represents a voltage value of the input terminal of the first transistor, R1 represents a resistance value of the first resistor, and Rx represents a resistance value of x resistive control sub-units arranged in parallel.

13. The current limiting circuit of claim 10, further comprising a timing unit, a comparison unit, and a constant current unit, wherein the timing unit is electrically connected to a first terminal of the comparison unit, a second terminal of the comparison unit is electrically connected to the second voltage terminal, a third terminal of the comparison unit receives a constant voltage signal, a fourth terminal of the comparison unit is electrically connected to a first terminal of the constant current unit, and a second terminal of the constant current unit is electrically connected to a control terminal of the fourth transistor, wherein the timing unit is configured to output a comparison-unit control signal at intervals with a preset time, wherein the comparison unit is controlled by the comparison-unit control signal to output a constant-current-unit control signal at the fourth terminal of the comparison unit to the first terminal of the constant current unit based on a voltage at the second terminal of the comparison unit and the voltage at the third terminal of the comparison unit, and wherein the constant current unit is controlled by the constant-current-unit control signal to output a constant current.

14. The current limiting circuit of claim 13, wherein the timing unit comprises a timer, and the timer is electrically connected to the first terminal of the comparison unit.

15. The current limiting circuit of claim 13, wherein the comparison unit comprises a comparator, wherein a first terminal of the comparator is electrically connected to the timing unit, a second terminal of the comparator is electrically connected to the second voltage terminal, a third terminal of the comparator receives the constant voltage signal, and a fourth terminal of the comparator is electrically connected to the first terminal of the constant current unit.

16. The current limiting circuit of claim 13, wherein the constant current unit comprises a constant current source, wherein a first terminal of the constant current source is electrically to the fourth terminal of the comparison unit, a second terminal of the constant current source is electrically to the control terminal of the fourth transistor, and a third terminal of the constant current source is electrically to a ground terminal.

17. The current limiting circuit of claim 13, wherein a voltage value of constant voltage signal in a range between 0.85 times a voltage value of the first voltage terminal and 0.9 times the voltage value of the first voltage terminal.

18. A current limiting circuit, comprising:
a first voltage terminal;
a second voltage terminal;
a first transistor, wherein an input terminal of the first transistor is electrically connected to the first voltage terminal, and an output terminal of the first transistor is electrically connected to the second voltage terminal; and a current limiting module electrically connected to the input terminal of the first transistor and a control terminal of the first transistor, wherein the current limiting module is configured to control voltage difference between the control terminal of the first transistor and the input terminal of the first transistor for controlling a state of the first transistor so that a current limiting value of the current limiting circuit is adjustable; and wherein the current limiting circuit further comprises a fourth transistor, wherein an input terminal of the fourth transistor is electrically connected to the first voltage terminal, and an output terminal of the fourth transistor is electrically connected to the second voltage terminal.

* * * * *